(12) United States Patent
Sugawara et al.

(10) Patent No.: US 6,897,149 B2
(45) Date of Patent: May 24, 2005

(54) METHOD OF PRODUCING ELECTRONIC DEVICE MATERIAL

(75) Inventors: Takuya Sugawara, Nirasaki (JP); Toshio Nakanishi, Amagasaki (JP); Shigenori Ozaki, Amagasaki (JP); Seiji Matsuyama, Nirasaki (JP); Shigemi Murakawa, Tokyo (JP); Yoshihide Tada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/470,198

(22) PCT Filed: Jan. 25, 2002

(86) PCT No.: PCT/JP02/00571

§ 371 (c)(1),
(2), (4) Date: Jul. 25, 2003

(87) PCT Pub. No.: WO02/059956

PCT Pub. Date: Aug. 1, 2002

(65) Prior Publication Data

US 2004/0048452 A1 Mar. 11, 2004

(30) Foreign Application Priority Data

Jan. 25, 2001 (JP) .......................................... 2001-17664

(51) Int. Cl.$^7$ .............................................. H01L 21/44
(52) U.S. Cl. ....................................... 438/680; 438/792

(58) Field of Search ........................... 438/680, 30, 695, 438/720, 743, 744, 756, 757, 770, 771, 772, 774, 775, 776, 777, 787, 788, 791, 795, 792

(56) References Cited

U.S. PATENT DOCUMENTS

| 4,822,450 A | * | 4/1989 | Davis et al. ................. 438/709 |
| 4,863,558 A | * | 9/1989 | Jucha et al. ................. 438/695 |
| 4,988,533 A | * | 1/1991 | Freeman et al. ............ 427/563 |
| 6,650,678 B1 | * | 11/2003 | Ohmi et al. ................... 372/82 |

FOREIGN PATENT DOCUMENTS

| EP | 1028458 | 1/2000 |
| JP | 11-293470 | 10/1999 |
| JP | 2000-106438 | 4/2000 |
| JP | 2000-124214 | 4/2000 |
| JP | 2000-332245 | 11/2000 |

* cited by examiner

*Primary Examiner*—David Nhu
(74) *Attorney, Agent, or Firm*—Crowell & Moring LLP

(57) ABSTRACT

A process for producing an electronic device material of a high quality MOS-type semiconductor having an insulating layer and a semiconductor layer with excellent electrical characteristics. A substrate incorporating single-crystal silicon as a main component is CVD-treated to form an insulating layer. The substrate is then exposed to a plasma generated from a process gas by microwave radiation from a plane antenna having a plurality of slots, to thereby modify the insulating film.

34 Claims, 13 Drawing Sheets

PRIOR ART

METHOD OF PRODUCING ELECTRONIC DEVICE MATERIAL

TECHNICAL FIELD

The present invention relates to a process which is suitably usable for the production of materials to be used for electronic devices. The process for producing a material for electronic device according to the present invention may be used, for example, for forming an MOS-type semiconductor structure.

BACKGROUND ART

Hitherto, various kinds of layer-forming techniques have been used in the cases of the formation of plural layers constituting semiconductors or semiconductor materials. Representative examples of these layer-forming techniques may include, e.g., vacuum evaporation processes, sputtering processes, and CVD (chemical vapor deposition) processes. Among these layer-forming techniques, the CVD process has certain characteristics such that it can provide a high film-forming deposition rate for the layer formation, and it can accomplish the film formation within a relatively short period. Accordingly, the CVD process has been used for many steps in the production of various kinds of materials for electronic devices or semiconductors such as MOS-type semiconductor devices.

In general, the production process according to the present invention is widely applicable to the production of materials for electronic devices. For the convenience of explanation, however, the background art relating to an EPROM, an embodiment of the nonvolatile memory called "flash memory", will be described here.

EPROM has, for example a multi-layer structure as shown in FIG. 12.

Referring to FIG. 12, the multi-layer structure of the EPROM comprises: a substrat 100 to be processed comprising p-type single-crystal silicon; a multi-layer structure disposed on the substrate 100, wherein an insulating layer 101 of $SiO_2$, and semiconductor layers 102 and 103 of polycrystal silicon are alternatively stacked while forming predetermined patterns; and a metal layer 104 of a metal (aluminum, copper, etc.) disposed on the multi-layer structure.

In such a semiconductor device, the above-mentioned CVD process is widely used for forming the semiconductor layers 102 and 103 of polycrystal silicon, and the interlayer $SiO_2$ layers disposed therebetween.

However, in the layers formed by the CVD process, the resultant surface roughness, and defects in the film are relatively noticeable, and the valences of atomic bonding called "dangling bonds" are liable to be formed so that the dangling bonds are directed toward the inside of the film. When these dangling bonds are formed so that they are directed toward the inside of the film, the dangling bonds can affect the flows of electrons in this layer and other adjacent layers. As a result, there can occur a problem such that electric characteristics of the layer can be deteriorated, and the quality of the resultant electronic device per se can be deteriorated accordingly.

DISCLOSURE OF INVENTION

An object of the present invention is to provide a process for producing a material for electronic device which can solve the above-mentioned problems encountered in the prior art.

Another object of the present invention is to provide a production process which can improve the electrical characteristic of the layer constituting an electronic device (semiconductor, for example) so as to provide an electronic device having an excellent quality.

A further object of the present invention is to provide a process for producing a material for electronic device which can provide an electronic device (MOS-type semiconductor, for example) having an insulating layer and a semiconductor layer excellent in the electrical characteristic.

The present invention provides a process for producing an electronic device material, comprising: a step of exposing a substrate to be processed comprising at least a substrate for an electronic device, and an insulating film disposed on the substrate, to a plasma which has been generated from a process gas on the basis of microwave irradiation via a plane antenna member having a plurality of slots, to thereby modify the insulating film.

The present invention also provides a process for producing an electronic device material, comprising: a step of exposing a substrate to be processed comprising at least a substrate for an electronic device, a first $SiO_2$ film disposed on the substrate, a first polycrystal silicon layer disposed on the first $SiO_2$ film, and a second $SiO_2$ film disposed on the first polycrystal silicon layer; to a plasma which has been generated from a process gas on the basis of microwave irradiation via a plane antenna member having a plurality of slots, to thereby modify the second $SiO_2$ film.

The present invention further provides a process for producing an electronic device material, comprising: a step of exposing a substrate to be processed comprising at least a substrate for an electronic device, and an insulating film disposed on the substrate, to a plasma which has been generated from a process gas on the basis of microwave irradiation via plane antenna member having a plurality of slots, to thereby modify the insulating layer; and a step of forming a metal layer on the insulating layer.

Figure 1:
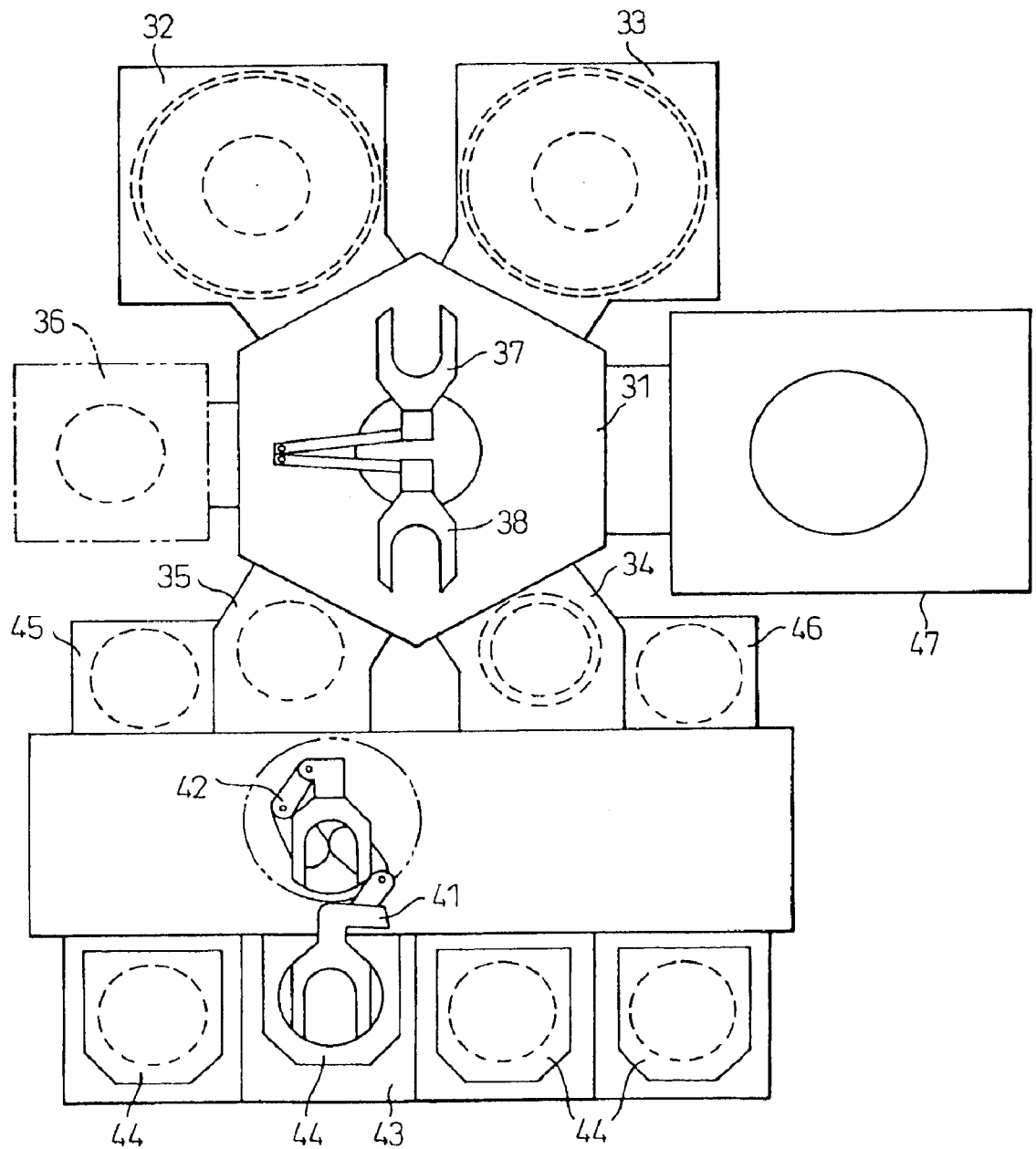
FIG. 1 is a schematic view (schematic plan view) showing an example of the semiconductor manufacturing equipment for conducting the process for producing an electronic device material according to the present invention.

In the above-mentioned figures, the respective reference numerals have the following meanings:

W: wafer (substrate to be processed), 60: SPA (plane antenna member), 23: insulating film (first $SiO_2$ film), 32: plasma processing unit (process chamber), 33: CVD processing unit (process chamber), 47: heating reaction furnace.

BEST MODE FOR CARRYING OUT THE INVENTION

Hereinbelow, the present invention will be described in detail with reference to the accompanying drawings as desired. In the following description, "n%", and "part(s)" representing a quantitative proportion or ratio are those based on mass, unless otherwise noted specifically.
(Production Process for Electronic Device Materials)

The production process for an electronic device material according to the present invention comprises, at least, a step of exposing a substrate (or base material) to be processed comprising at least a layer of electronic device material, and an insulating film disposed on the layer of electronic device material, to a plasma which has been generated from a process gas on the basis of microwave irradiation via (or through the medium of) a plane antenna member having a plurality of slots, to thereby modify the insulating film.
(Electronic Device Material)

The electronic device material to be usable in the present invention is not particularly limited, but may appropriately be selected from one kind or combination of at least two kinds of known electronic device materials. Examples of such an electronic device material may include: semiconductor materials, liquid crystal device materials, etc. Examples of the semiconductor material may include: materials comprising silicon as a main component (such as single-crystal silicon, poly-silicon, and amorphous silicon), materials comprising silicon nitride film as a main component, and materials comprising silicon germanium as a main component.
(Insulating Film)

The insulating film to be disposed on the layer of above-mentioned electronic device material is not particularly limited, but may appropriately be selected from one kind or combination of at least two kinds of known insulating films for electronic device materials. Examples of such an insulating film may include: silicon oxide ($SiO_2$) films, silicon nitride (SiN) films, etc. In view of thermal history or thermal hysteresis, and productivity, the silicon oxide film may preferably be a film which has been formed by CVD.

(Process Gas)

The process gas to be usable in the present invention is not particularly limited, but may appropriately be selected from one kind or combination of at least two kinds of known process gases usable for the production of electronic devices. The examples of such a process gas may include: a mixed gas comprising an inert gas and oxygen ($O_2$), or an inert gas, nitrogen ($N_2$) and hydrogen ($H_2$).
(Inert Gas)

The inert gas to be usable in the present invention is not particularly limited, but may appropriately be selected from one kind or combination of at least two kinds of known inert gases usable for the production of electronic devices. The examples of such an inert gas may include krypton (Kr), xenon (Xe), helium (He) or argon (Ar).

In the insulating film modification according to the present invention, in view of the characteristic of the modified film to be formed, the following modifying conditions may suitably be used.

$O_2$: 1–1000 sccm, more preferably 10–500 sccm

Inert gas (for example, Kr, Ar, He or Xe): 200–3000 sccm, more preferably 500–2000 sccm, $H_2$: 1–200 sccm, more preferably 1–50 sccm, Temperature: room temperature (25° C.) to 700° C., more preferably room temperature to 500° C.

Pressure: 20–5000 mTorr, more preferably 20–3000 mTorr, particularly preferably, 50–2000 mTorr Microwave: 0.5–5 W/cm$^2$, more preferably 1–4 W/cm$^2$
(Examples of Suitable Condition)

In the production process according to the present invention, in view of the characteristic of the modified film to be formed, the following conditions may be exemplified as preferred examples thereof.

A preferred example of process gas: gas comprising $O_2$ or $N_2$ at a flow rate of 10–500 sccm, and Kr, He, Xe or Ar at a flow rate of 500–2000 sccm.

A preferred example of $SiO_2$ film-treating condition: room temperature to 500° C.

A preferred example of $SiO_2$ film-treating condition: 2.7–270 Pa (20–2000 mTorr)

A preferred example of $SiO_2$ film-forming condition: plasma which has been generated by an output of 1–4 W/cm$^2$.
(Embodiment of Modifying $SiO_2$ Film Disposed on Polycrystal Silicon Layer)

The present invention also provides as another embodiment, a process for producing an electronic device material, comprising: a step of exposing a substrate to be processed comprising at least a substrate for an electronic device, a first $SiO_2$ film disposed on the substrate, a first polycrystal silicon layer disposed on the first $SiO_2$ film, and a second $SiO_2$ film disposed on the first polycrystal silicon layer; to a plasma which has been generated from a process gas on the basis of microwave irradiation via a plane antenna member having a plurality of slots, to thereby modify the second $SiO_2$ film. When such an $SiO_2$ film disposed on the polycrystal silicon layer is modified in this manner, the resultant operational reliability can advantageously be improved.

As the control gate electrode for a flash memory, for example, it is possible to form a second polycrystal silicon layer on the above-mentioned second $SiO_2$ film which has been modified in this manner. Instead of the second $SiO_2$ film, it is also possible to form another insulating film, such as SiN, or stacked or multi-layer structure comprising SiN and $SiO_2$, When the second polycrystal silicon layer is formed on such a modified $SiO_2$ film, the resultant operational reliability can further be improved advantageously.

When the above-mentioned first polycrystal silicon layer, the second $SiO_2$ film and/or the second polycrystal silicon layer are formed by using CVD, it is more advantageous than thermal oxidation as a reduction in the thermal history. In view of the productivity, it is most preferred to form all of these first polycrystal silicon layer, second $SiO_2$ film and second polycrystal silicon layer by using CVD.

The above-mentioned embodiment of the production process for an electronic device material, can further comprises: between the step of forming the first polycrystal silicon layer and the step of forming the second $SiO_2$ film on the first polycrystal silicon layer; and/or after the formation of the second polycrystal silicon layer; a step of exposing the substrate to be processed to the plasma which has been generated from a process gas on the basis of microwave irradiation via a plane antenna member having a plurality of slots, to thereby modify the first or second polycrystal silicon layer. As described above, when the process further includes an additional step of exposing the substrate to be processed to plasma which has been generated from the process gas based on the microwave irradiation via a plane antenna member, the surface of the first and second polycrystal silicon layers may be smoothed, whereby the reliability of the second $SiO_2$ film can be expected to be improved. In addition, the oxidation resistance of the first and second polycrystal silicon may be improved by this step, and therefore a change in the area of the polycrystal silicon in the subsequent step may be expected to be suppressed. Further, when the polycrystal silicon surface is oxidized in this process by using the process gas plasma which has been generated via SPA, the second $SiO_2$ can also be formed. This step can be conducted at a low temperature. In the ordinary thermal oxidation process, the device characteristic can be deteriorated by a high temperature. However, when the above-mentioned step is used, an oxide film can be formed while suppressing the degradation of the device characteristic due to a thermal process (diffusion of dopant, etc.).

(Embodiment of Forming Metal Layer on Modified Insulating Layer)

The present invention also provides, as a further embodiment, a process for producing an electronic device material, comprising: a step of exposing a substrate to be processed comprising at least a substrate for an electronic device, and an insulating film disposed on the substrate, to a plasma which has been generated from a process gas on the basis of microwave irradiation via plane antenna member having a plurality of slots, to thereby modify the insulating layer; and a step of forming a metal layer on the insulating layer. When the metal layer is formed on the insulating film which has been modified in this manner, the operation reliability can advantageously be improved, or the leakage can advantageously be reduced.

(Material of Insulating Film)

In the above production process for an electronic device, examples of the former insulating film (gate insulator, for example) may include: one or at least two kinds selected from the group including: known materials such as $SiO_2$, SiON and SiN having a low dielectric constant; $Al_2O_3$, $ZrO_2$, $EfO_2$, $Ta_2O_5$ having a high dielectric constant; silicates such as ZrSiO, EfSiO and aluminates such as ZrAlO.

(Plane Antenna Member)

In the production process for electronic device material according to the present invention, a high-density plasma having a low electron temperature is generated by irradiating microwave via a plane antenna member having a plurality of slots; and a film is modified by utilizing the thus generated plasma. As a result, the present invention can provide a process which accomplishes a light plasma damage, and a high reactivity at a low temperature.

The film which has been modified according to the present invention is one which has been modified by using the high-density plasma having a low electron temperature generated by irradiating microwave via a plane antenna member having a plurality of slots, and accordingly, the dangling bonds in the film are terminated in an ideal sate. As a result, the insulation characteristic of the film per se can be improved, to thereby provide an electronic device material (for example, semiconductor material) having an excellent characteristic. In addition, this process can be conducted by setting the wafer temperature, and the chamber temperature to a low temperature, and therefore the process can be an energy-saving process.

(Preferred Plasma)

Preferred plasma characteristics of the plasma which may preferably been used in the present invention are as follows.

Electron temperature: 0.5–2.0 eV

Density: $1 \times 10^{10}$ to $5 \times 10^{12}/cm^3$

Uniformity in plasma density: ±10% or less

According to the present invention, a modified insulating film having a high quality can be formed. Therefore, it is easy to form a semiconductor device structure having an excellent characteristic by forming another layer (for example, electrode layer) on this modified insulating film.

(Preferred Characteristic of Insulating Film)

The present invention may easily form a modified insulating film having a preferred characteristic as follows.

Reduction in leakage current: the electric power consumption of the resultant device is lowered, and when applied to a flash memory, a long storage-retention time can be accomplished.

Improvement in reliability: the deterioration along with an increase in the number of operations can be suppressed.

(Preferred Characteristic of Semiconductor Structure)

The applicable range or extent of the production process according to the present invention is not particularly limited. A high-quality modified insulating film which can be formed by the present invention can be utilized as an insulating film for constituting a flash memory structure.

The present invention can easily provide a flash memory structure having a preferred characteristic as follows. In addition, when the characteristic of the insulating film which has been modified by the present invention is evaluated, for example, instead of evaluating the property of the above-mentioned insulating film per se, it is possible that a standard flash memory structure as described in a paper (IEEE TRANSACTIONS ON ELECTRONIC DEVICES, Vo146, No.9, SEPTEMBER 1999 pp1866–1871) is formed, and the characteristic of the resultant flash memory is evaluated. This is because, in such a standard flash memory structure, the characteristic of the insulating film constituting the flash memory structure has a strong influence on the resultant flash memory characteristic.

Characteristic: excellent stability in repetitive operations (Embodiment of Producing Electronic Device Material)

Hereinbelow, an embodiment in the present invention will be described.

At first, there is described a manufacturing equipment which is usable for the process for producing a flash memory according to the present invention.

FIG. 1 is schematic view (schematic plan view) showing an example of the total arrangement of an electronic device (semiconductor device)-manufacturing equipment 30 for conducting the process for producing electronic device material according to the present invention.

Figure 2:
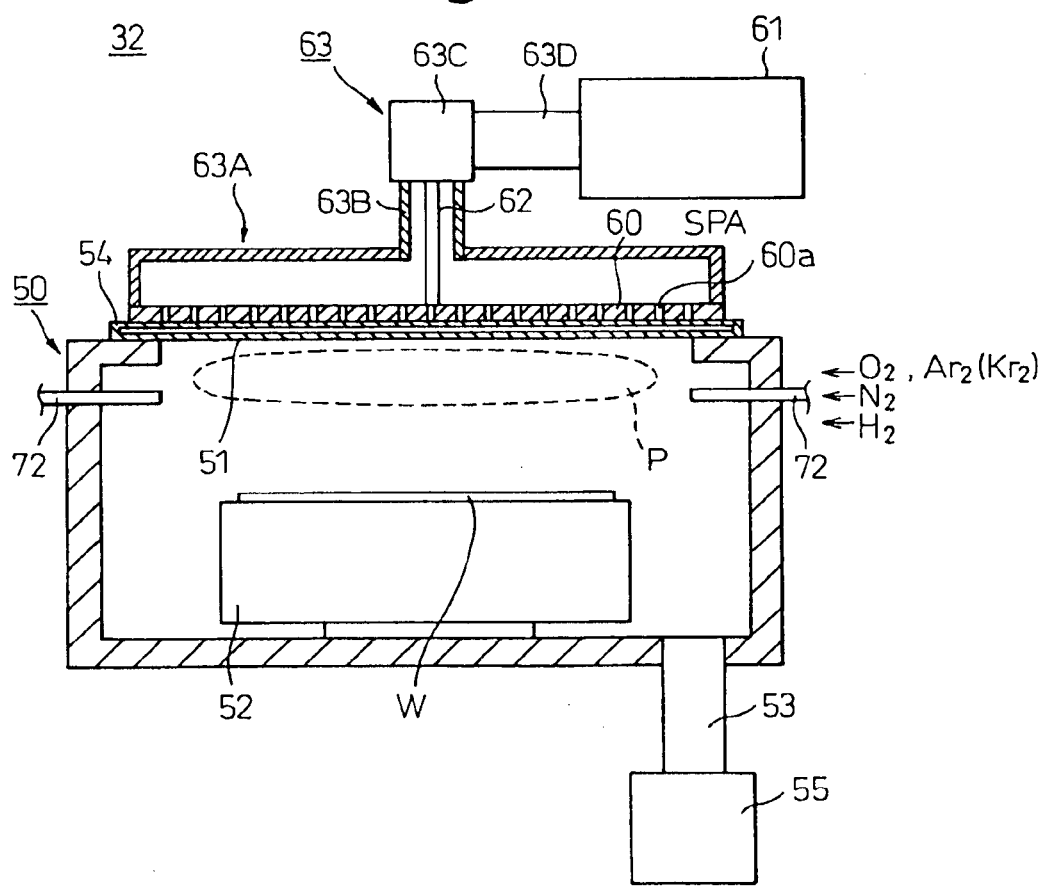
FIG. 2 is a schematic vertical sectional view showing an example of the plasma processing unit comprising a slot plain (or planar) antenna (hereinafter, referred to as "SPA"), which is usable in the process for producing electronic device material according to the present invention.

As shown in FIG. 1, in a substantially central portion of the semiconductor manufacturing equipment 30, there is disposed a transportation chamber 31 for transporting a wafer W (FIG. 2). Around the transportation chamber 31, there are disposed: a CVD processing unit 33, a plasma processing unit 32 for conducting various treatments on the wafer, two load lock units 34 and 35 for conducting the communication/cutoff operations between the respective processing chambers, a heating unit 36 for operating various heating treatments, and a heating reaction furnace 47 for conducting various heating treatments on the wafer. These units are disposed so as to surround the transportation chamber 31. Alternatively, it is also possible to provide the heating reaction furnace 47 independently and separately from the semiconductor manufacturing equipment 30.

On the side of the load lock units 34 and 35, a preliminary cooling unit 45 and a cooling unit 46 for conducting various kinds of preliminary cooling and cooling treatments are disposed.

In the inside of transportation chamber 31, transportation arms 37 and 38 are disposed, so as to transport the wafer W (FIG. 2) between the above-mentioned respective units 32–36.

On the foreground side of the load lock units 34 and 35 in this figure, loader arms 41 and 42 are disposed. These loader arms 41 and 42 can put wafer W in and out with respect to four cassettes 44 which are set on the cassette stage 43, which is disposed on the foreground side of the loader arms 41 and 42.

Further, the plasma processing unit 32 and the CVD processing unit 33 can be exchanged. It is possible to exchange the plasma processing unit 32 and the CVD processing unit 33 with each other; and/or it is possible to set one or two of single-chamber type CVD processing unit or plasma processing unit in the position of the plasma processing unit 32 and CVD processing unit 33.

(One Embodiment of Plasma Processing)

FIG. 2 is a schematic sectional view in the vertical direction showing a plasma processing unit 32 which is usable in the processing according to the present invention.

Referring to FIG. 2, reference numeral 50 denotes a vacuum container made of, e.g., aluminum. In the upper portion of the vacuum container 50, an opening portion 51 is formed so that the opening portion 51 is larger than a substrate (for example, wafer W). A top plate 54 in a flat cylindrical shape made of a dielectric such as quartz and aluminum oxide is provided so as to cover the opening portion 51. In the side wall of the upper portion of vacuum container 50 which is below the top plate 54, gas feed pipes 72 are disposed in 16 positions, which are arranged along the circumferential direction so as to provide equal intervals therebetween. A process gas comprising at least one kind of gas selected from $O_2$, inert gases, $N_2$, $H_2$, etc., can be supplied into the plasma region P in the vacuum container 50 from the gas feed pipes 72 evenly and uniformly.

On the outside of the top plate 54, there is provided a radio-frequency power source, via a plane antenna member having a plurality of slits, which comprises a slot plane antenna (SPA) 60 made from a copper plate, for example. As the radio-frequency power source, a waveguide 63 is disposed on the top plate 54 by the medium of the SPA 60, and the waveguide 63 is connected to a microwave power supply 61 for generating microwave of 2.45 GHz, for example. The waveguide 63 comprises a combination of: a flat circular waveguide 63A, of which lower end is connected to the SPA 60; a circular waveguide 63B, one end of which is connected to the upper surface side of the circular waveguide 63A; a coaxial waveguide converter 63C connected to the upper surface side of the circular waveguide 63B; and a rectangular waveguide 63D, one end of which is connected to the side surface of the coaxial waveguide converter 63C so as to provide a right angle therebetween, and the other end of which is connected to the microwave power supply 61.

In the present invention, a frequency region including UHF and microwave is referred to as radio-frequency (or high-frequency) region. The radio-frequency power supplied from the radio-frequency power source may preferably have a frequency of not smaller than 300 MHz and not larger than 2500 MHz, which may include UHF having a frequency of not smaller than 300 MHz and microwave having a frequency of not smaller than 1 GHz. In the present invention, the plasma generated by the radio-frequency power is referred to as "radio-frequency plasma".

In the inside of the above-mentioned circular waveguide 63B, an axial portion 62 of an electroconductive material is coaxially provided, so that one end of the axial portion 62 is connected to the central (or nearly central) portion of the SPA 60 upper surface, and the other end of the axial portion 62 is connected to the upper surface of the circular waveguide 63B, whereby the circular waveguide 63B constitutes a coaxial structure. As a result, the circular waveguide 63B is constituted so as to function as a coaxial waveguide.

In addition, in the vacuum container 50, a stage 52 for carrying the wafer w is provided so that the stage 52 is disposed opposite to the top plate 54. The stage 52 contains a temperature control unit (not shown) disposed therein, so that the stage can function as a hot plate. Further, one end of an exhaust pipe 53 is connected to the bottom portion of the vacuum container 50, and the other end of the exhaust pipe 53 is connected to a vacuum pump 55.

(One Embodiment of SPA)

Figure 3:
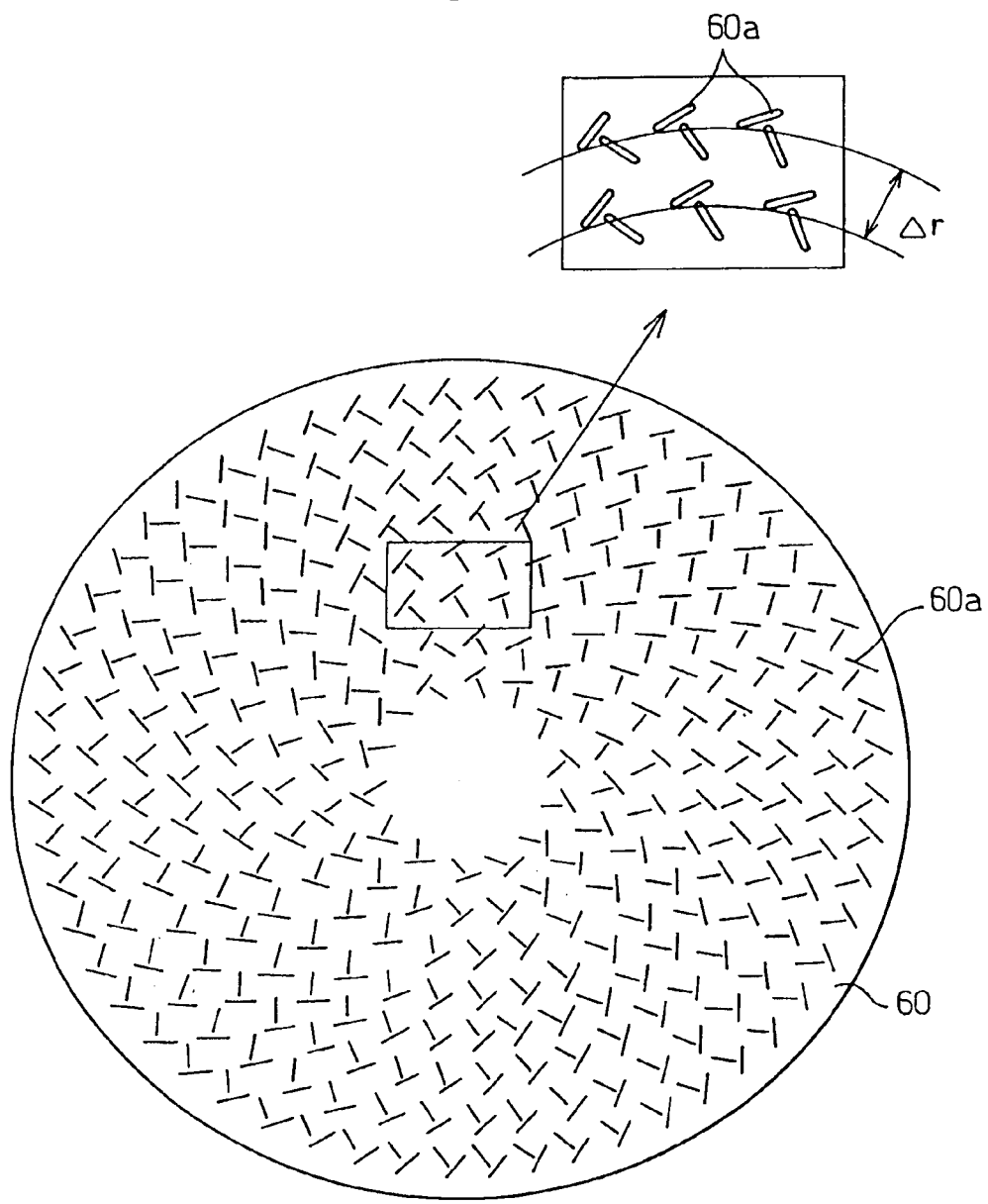
FIG. 3 is a schematic plan view showing an example of the SPA which is usable in an apparatus for producing electronic device material according to the present invention.

FIG. 3 is a schematic plan view showing an example of SPA 60 which is usable in an apparatus for producing an electronic device material according to the present invention.

As shown in this FIG. 3, on the surface of the SPA 60, a plurality of slots 60a, 60a, . . . are provided in the form of concentric circles. Each slot 60a is a substantially square penetration-type groove. The adjacent slots are disposed perpendicularly to each other and arranged so as to form a shape of alphabetical "T"-type character. The length and the interval of the slot 60a arrangement are determined in accordance with the wavelength of the microwave supplied from the microwave power supply unit 61.

(One Embodiment of CVD Processing Unit)

Figure 4:
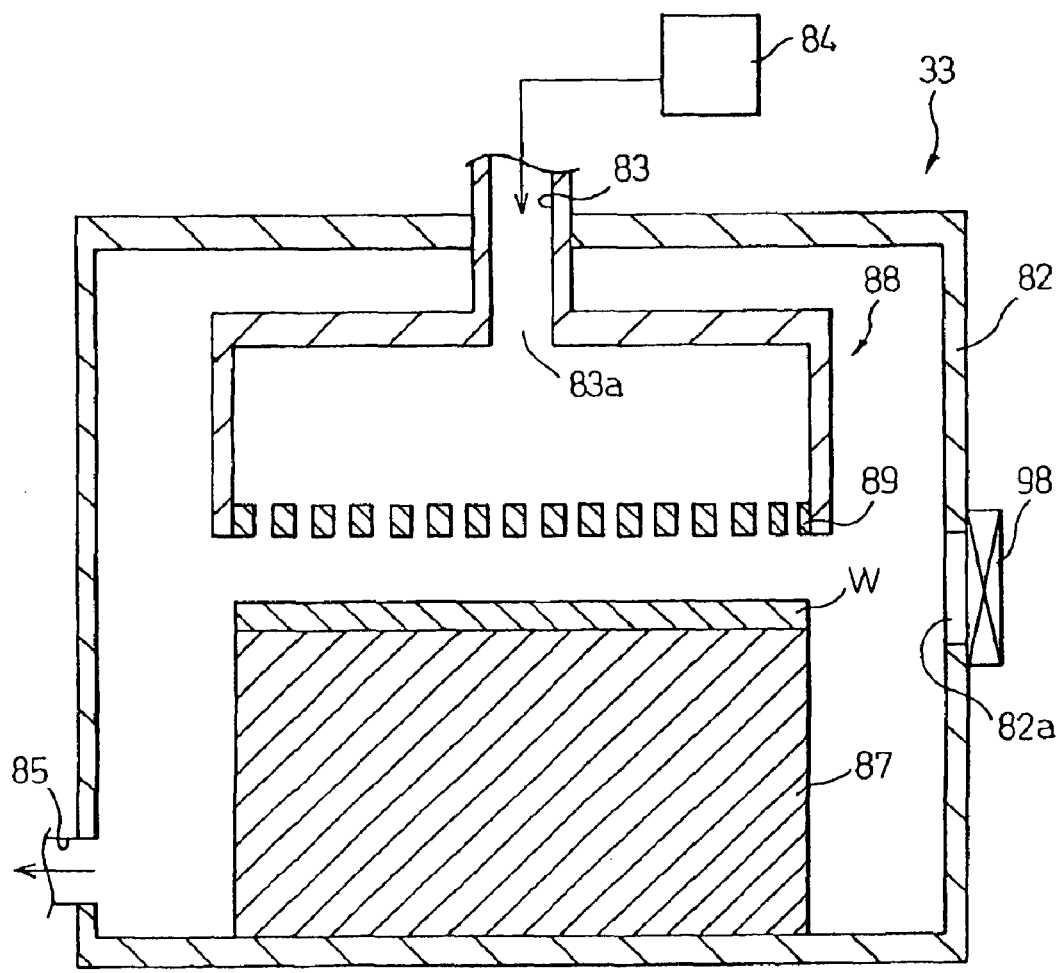
FIG. 4 is a schematic vertical sectional view showing an example of the CVD processing unit which is usable for a process for producing electronic device material according to the present invention.

FIG. 4 is schematic sectional view in the vertical direction showing an example of the CVD processing unit 33 which is usable in an apparatus for producing an electronic device material according to the present invention.

As shown in FIG. 4, a processing chamber 82 of the CVD processing unit 33 is formed into an air-tight structure by using aluminum, for example. A heating mechanism and a cooling mechanism are provided in the processing chamber 82, although these mechanisms are not shown in FIG. 4.

As shown in FIG. 4, a gas introduction pipe 83 for introducing a gas into the processing chamber 82 is connected to the upper central portion of the processing chamber 82, the inside of the processing chamber 82 is communicates with the inside of the gas introduction pipe 83. In addition, the gas introduction pipe 83 is connected to a gas supply source 84. A gas is supplied from the gas supply source 84 into the gas introduction pipe 83, and the gas is introduced into the processing chamber 82 through the gas introduction pipe 83. As the gas in this case, it is possible to use one of various gases such as raw material gas for forming a gate electrode (electrode-forming gas) such as silane, for example. AS desired, it is also possible to use an inert gas as a carrier gas.

A gas exhaust pipe 85 for exhausting the gas in the processing chamber 82 is connected to the lower portion of the processing chamber 82, and the gas exhaust pipe 85 is connected to exhaust means (not shown) such as vacuum pump. On the basis of the exhaust means, the gas in the processing chamber 82 is exhausted through the gas exhaust pipe 85, and the processing chamber 82 is maintained at a desired pressure.

In addition, a stage 87 for carrying wafer W is provided in the lower portion of the processing chamber 82.

In the embodiment as shown in FIG. 4, the wafer W is carried on the stage 87 by means of an electrostatic chuck (not shown) having a diameter which is substantially the same as that of the wafer W. The stage 87 contains a heat source means (not shown) disposed therein, to thereby constitute a structure wherein the surface of the wafer W to be processed which is carried on the stage 87 can be adjusted to a desired temperature.

The stage 87 has a mechanism which is capable of rotating the wafer W carried on the stage 87, as desired.

In FIG. 4, an opening portion 82a for putting the wafer W in and out with respect to the processing chamber 82 is provided on the surface of the right side of the processing chamber 82 in this figure. The opening portion 82a can be opened and closed by moving a gate valve 98 vertically (up and down direction) in this figure. In FIG. 4, a transportation arm (not shown) for transporting the wafer is provided adjacent to the right side of the gate valve 98. In FIG. 4, the wafer W can be carried on the stage 87, and the wafer W after the processing thereof is transported from the processing chamber 82, as the transportation arm enters the processing chamber 82 and goes out therefrom through the medium of the opening portion 82a.

Above the stage 87, a shower head 88 as a shower member is provided. The shower head 88 is constituted so as to define the space between the stage 87 and the gas introduction pipe 83, and the shower head 88 is formed from aluminum, for example.

The shower head 88 is formed so that the gas exit 83a of the gas introduction pipe 83 is positioned at the upper central portion of the shower head 88. The gas is introduced into the processing chamber 82 through gas feeding holes 89 provided in the lower portion of the shower head 88.

(Embodiment of Production of Electronic Device Material)

Next, there is described one embodiment of the production process for an electronic device material according to the present invention.

Figure 5:
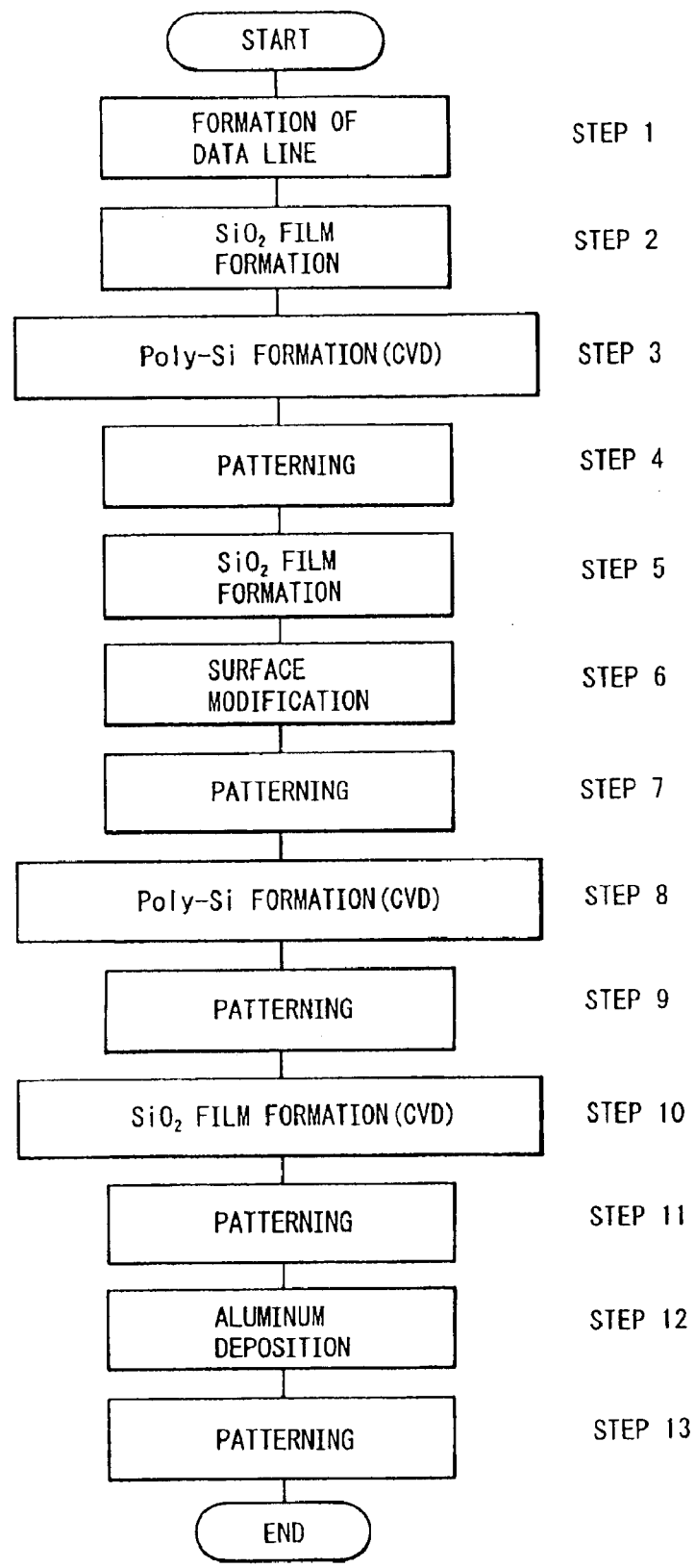
FIG. 5 is a flow chart showing examples of the respective steps in the production process according to the present invention.

FIG. 5 is a flowchart showing a process for producing an electronic device material according to this embodiment. FIGS. 6 to 8 are schematic vertical sectional views showing the respective manufacturing steps for a flash memory cell according to this embodiment.

Figure 6A:
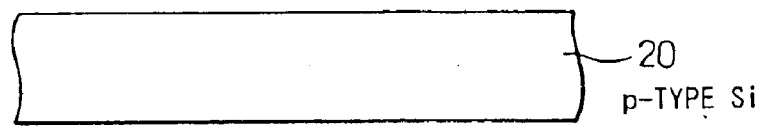
FIGS. 6A–6D are schematic sectional views in the vertical direction showing examples of the states of a flash memory according to the present invention in the course of the fabrication thereof.
Figure 6B:
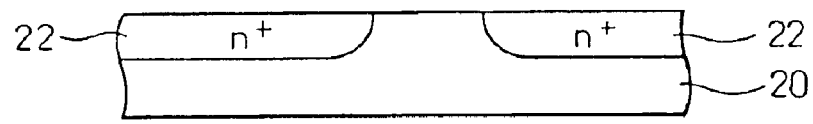

In this embodiment, at first, as shown in FIG. 5 and FIG. 6B, a wafer W comprising p-type Si as a substrate to be processed is selectively subjected to ion implantation and annealing steps, to thereby form a buried (or embedded) type data line (impurity-buried layer) 22 as an n+ layer (step 1).

Figure 6C:
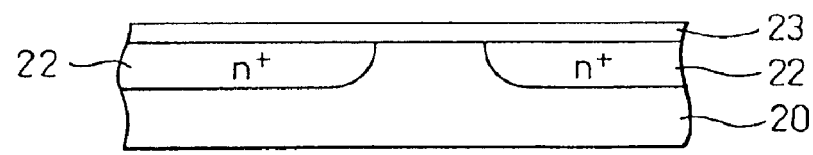

Next, as shown in FIG. 6C, in order to form a first insulating film, the surface of the wafer W is heated or CVD-treated, to thereby form an $SiO_2$ film (first $SiO_2$ film) 23 on the entire surface of the wafer W (step 2). Herein, when the $SiO_2$ film 23 is formed by heating oxidation, the heating unit 36 or heating reaction furnace 47 (FIG. 1) can be used. When the $SiO_2$ film 23 is formed by a CVD process, the CVD processing unit 33 (FIG. 1) can be used.

Figure 6D:
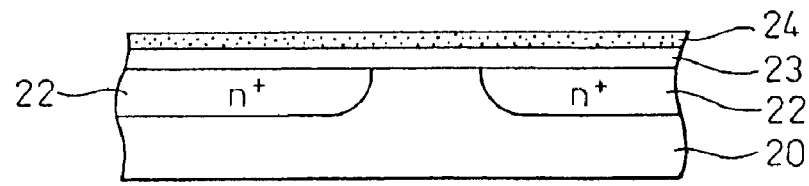

Next, as shown in FIG. 6D, the wafer W on the surface which the first $SiO_2$ film 23 has been formed, is brought into the CVD processing unit 33 chamber, to thereby form a polycrystal silicon layer 24 (first polycrystal silicon layer) on the surface of the above-mentioned first $SiO_2$ film 23 (step 3).

Figure 7A:
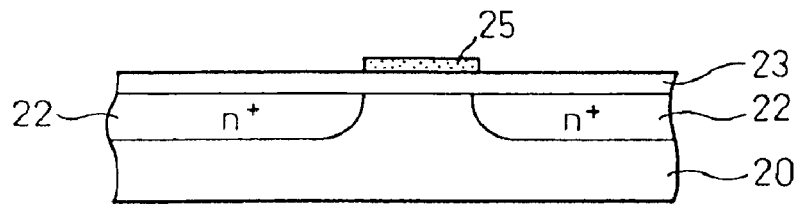
FIGS. 7A–7D are schematic sectional views in the vertical direction showing examples of the states of a flash memory according to the present invention in the course of the fabrication thereof.
Figure 7B:
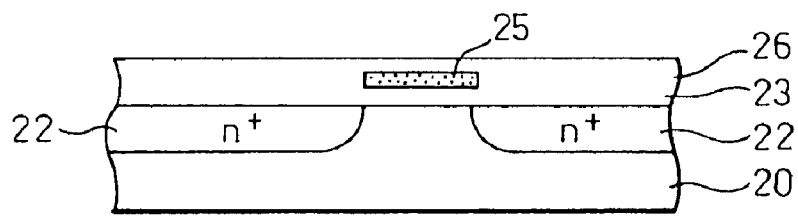
Figure 7C:
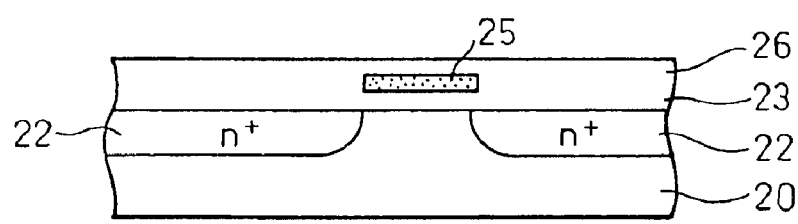

Subsequently, the first polycrystal silicon layer is selectively subjected to etching, e.g., by using a photolithography and dry etching techniques so as to conduct the patterning thereof (step 4), to thereby form a floating gate 25 on the $SiO_2$ film as shown in FIG. 7A.

Next, the wafer w is again brought into the CVD processing unit 33 (FIG. 1) so as to subject the surface of the wafer to CVD processing, to thereby form a second $SiO_2$ layer 26 as a second insulating layer on the above-mentioned exposed floating gate 25 (step 5).

Next, the wafer W is brought into the plasma processing unit 32 (FIG. 1), and the second $SiO_2$ layer 26 is plasma-treated, to thereby modify the second $SiO_2$ layer 26 (step 6).

More specifically, the transportation arms 37 and 38 are caused to enter the CVD processing unit 33, and the wafer W on the surface of which the $SiO_2$ layer has been formed is taken out from the CVD processing unit 33. Subsequently, a gate valve (not shown) provided at the side wall of the vacuum container 50 in the plasma processing unit 32 is opened, and the above-mentioned wafer W is placed on the stage 52 by means of transportation arms 37 and 38.

Next, the gate valve was closed so as to seal the inside of the vacuum container 50, and then the inner atmosphere therein is exhausted by the vacuum pump 55 through the exhaust pipe 53 so as to evacuate the vacuum container 50 to a predetermined degree of vacuum and a predetermined pressure in the container 50 is maintained. On the other hand, microwave (e.g., of 1.80 GHz and 2200 W) is generated by the microwave power supply 61, and the microwave is guided by the waveguide so that the microwave is introduced into the vacuum container 50 via the SPA 60 and the top plate 54, whereby radio-frequency plasma is generated in the plasma region P of an upper portion in the vacuum container 50.

Herein, the microwave is transmitted in the rectangular waveguide 63D in a rectangular mode, and is converted from the rectangular mode into a circular mode by the coaxial waveguide converter 63C. The microwave is then transmitted in the cylindrical coaxial waveguide 63B in the circular mode, and transmitted in the flat-plate waveguide 63A in the radial direction, and is emitted from the slots 60a of the SPA 60, and penetrates the plate 54 and is introduced into the vacuum container 50. In this case, microwave is used, and accordingly high-density plasma can be generated. Further, the microwave is emitted from a large number of slots 60a of the SPA 60, and accordingly the plasma is caused to have a highly uniform distribution.

Subsequently, while the wafer W is heated to 400° C., for example, by regulating the temperature of the stage 52, the modifying treatment is conducted by introducing via the gas feed pipe 72 a process gas for an oxide film formation comprising an inert gas such as krypton and argon, and $O_2$ gas at predetermined flow rates.

For example, this plasma treatment may preferably be conducted in the following conditions. A mixed gas comprising $O_2$ at a flow rate of 5–50 sccm and krypton at a flow rate of 500–2000 sccm is used as the process gas, and at a temperature of 300–700° C., at a pressure of 2.7–135 Pa (20–1000 mTorr), under an output of 1–3 W/cm$^2$ of plasma source, the plasma treatment may preferably be conducted.

In this step, the introduced process gas is activated (converted into radicals) by the plasma flux which has been generated in the plasma processing unit 32, and the SiO$_2$ film 26 covering the top surface of the wafer W is modified by the thus generated plasma. In this manner, the above-mentioned modifying step is conducted, e.g., for 40 seconds, and the surface of the SiO$_2$ film 26 disposed on the top surface of the wafer W is subjected to the plasma from the above process gas, to thereby modify the SiO$_2$ film. The plasma generated from the process gas at this time has a low electron temperature, and therefore, the bias between the plasma of the process gas and the SiO$_2$ film 26 has a low value. As a result, when the plasma of the process gas is caused to contact the SiO$_2$ film 26, the impact provided to the SiO$_2$ film 26 is a little. When the so-called process gas plasma collides with the surface of the SiO$_2$ film 26, the resultant plasma damage provided to the SiO$_2$ film 26 is a little. Therefore, the dangling bonds present in the surface of the SiO$_2$ film 26 and in the inside thereof are appropriately terminated, to thereby provide a SiO$_2$ film 26 in the state of a high-quality and fine grain or texture.

Next, after the modification due to the plasma is conducted in this manner, the resultant product is subjected to patterning, e.g., by selective etching (such as photolithography and dry etching techniques) (step 7).

Figure 7D:
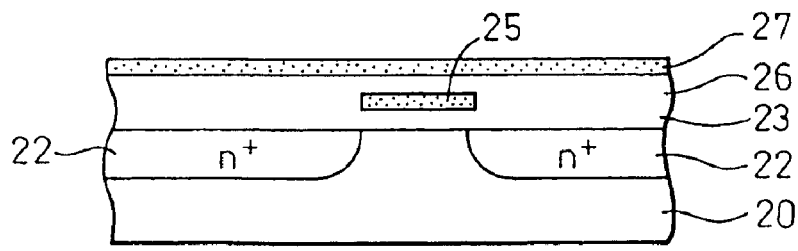

Subsequently, the wafer W of which patterning has been completed is brought into the CVD processing unit 33, and the wafer W is heated in the CVD processing unit 33, in the presence of, e.g., a process gas such as silane gas, to thereby form a second polycrystal silicon layer 27 on the whole surface of the above-mentioned modified SiO$_2$ film 26 as shown in FIG. 7D (step 8).

Figure 8A:
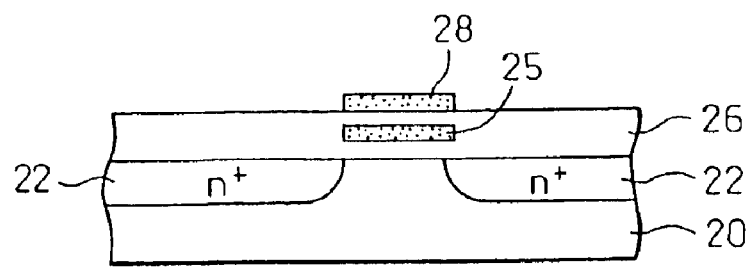
FIGS. 8A–8D are schematic sectional views in the vertical direction showing an example of the state of a flash memory according to the present invention in the course of the fabrication thereof.

Next, the second polycrystal silicon layer 27 is subjected to patterning by a selective etching method (step 9), to thereby form a control gate 28 as shown in FIG. 8A.

Figure 8B:
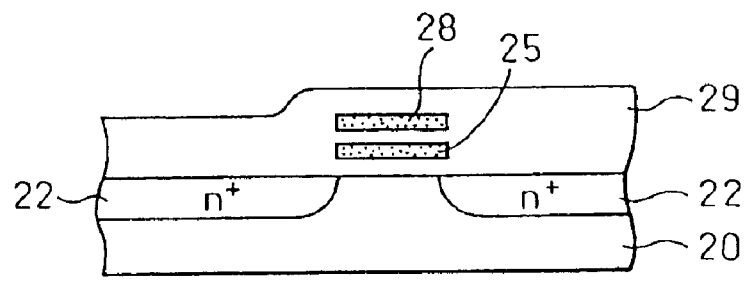

Subsequently, as shown in FIG. 8B, a third insulating layer (SiO$_2$ film) 29 is formed on the control gate 28 by CVD, for example (step 10).

Figure 8C:
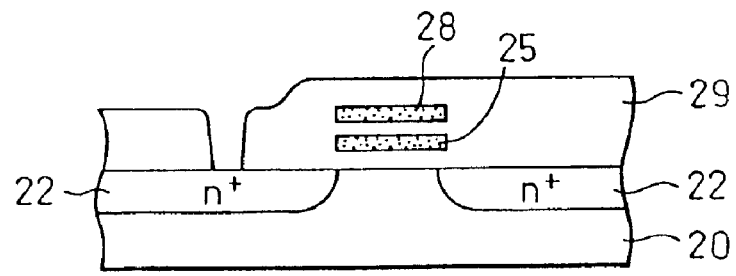

Subsequently, as shown in FIG. 8C, the third insulating layer is subjected to patterning so as to expose a portion of the data line (n+ layer) 22 (step 11).

Figure 8D:
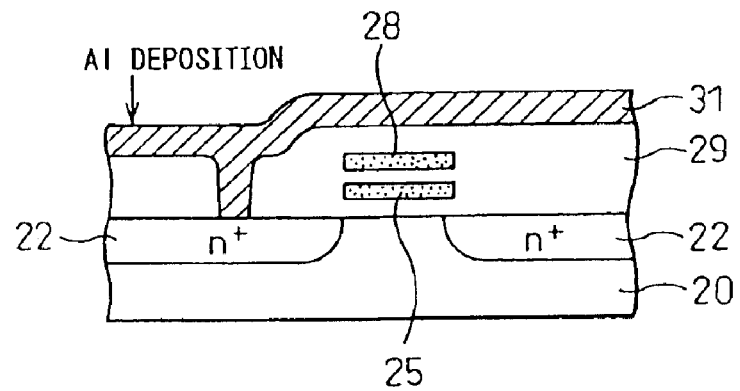

Further, as shown in FIG. 8D, a metal such as aluminum is deposited on the insulating layers 23, 26 and 29, and on the data line 22 by vacuum evaporation, to thereby form a metal layer 31 (step 12). Further, the metal layer 31 is subjected to patterning (by photolithography and selective etching, for example) so as to form an electrode (step 13).

Subsequently, a cell manufacturing steps are completed by the respective steps such as insulating film formation step, passivation layer formation step, contact-hole formation step and interconnection (or wiring) formation step in accordance with a general procedure (with respect to such cell manufacturing steps including insulating film formation step, passivation layer formation step, contact-hole formation step and interconnection formation step, a publication "ULSI TECHNOLOGY" McGRAW-HILL INTERNATIONAL EDITIONS, C. Y. CHANG, S. M. SZE may be referred to).

In the above-mentioned step (step 6) for modifying the SiO$_2$ film 26, at the time of modifying the SiO$_2$ film 26, the wafer W comprising single-crystal silicon as a main component is irradiated with microwave in the presence of a process gas via a plane antenna member (SPA) having a plurality of slots, so as to form plasma comprising oxygen (O$_2$) and an inert gas, to thereby modify the SiO$_2$ film 26 by using the thus generated plasma. As a result, a high-quality film can be provided, and the control of the film quality can successfully be conducted.

Figure 9:
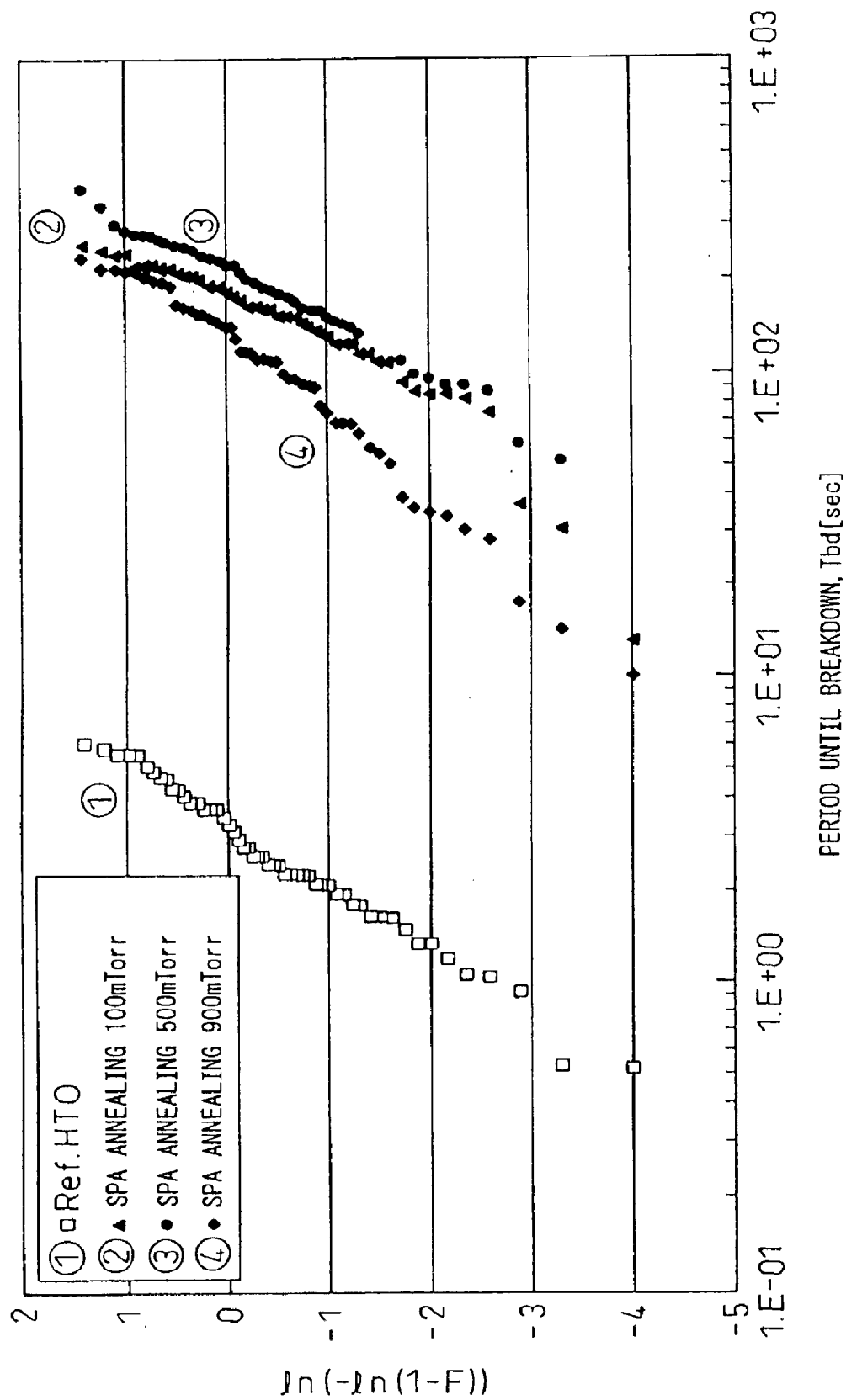
FIG. 9 is a graph for comparing various process conditions and the qualities of insulating films to be obtained under such process conditions.

The quality of the oxide film (SiO$_2$ film 26) after the above-mentioned modification is high as shown in the graph of FIG. 9.

FIG. 9 is a graph showing the results of evaluating the reliability of the SiO$_2$ film 26 which has been modified by subjecting the surface of the SiO$_2$ film 26 to plasma via SPA by the modifying step (step 6) constituting the above-mentioned embodiment of the process for producing an electronic device material.

In this graph, the ordinate shows the value of the failure rate, and the abscissa shows the Qbd value (dielectric breakdown electric charge).

The device structure to be used for this measurement was manufactured by a method as shown by the following items 1–7.

1: Substrate

As the substrate, a P-type or N-type silicon substrate is used, and the substrate has a specific resistance of 1–30 Ωcm, and a plane orientation of (100). A 500 A-sacrificial oxide film is formed on the surface of the silicon substrate.

2: Preliminary Washing Prior to Gate Oxidation

The sacrificial oxide film and contaminating elements (metals organic matters, particles) were removed by using the RCA-washing by use of a combination of APM (liquid mixture of ammonia, aqueous hydrogen peroxide, and pure water), HPM (liquid mixture of hydrochloric acid, aqueous hydrogen peroxide, and pure water) and DHF (liquid mixture of hydrofluoric acid and pure water).

3: Film Formation of SiO$_2$ Film

An SiO$_2$ film was formed by CVD. A 60 A-CVD oxide film (High Temperature Oxide: HTO) was formed, by using a 30 minute-treatment wherein SiH$_2$Cl$_2$ and N$_2$O were flown onto the above-mentioned substrate which had been heated to 780° C. at flow rates of 200 sccm and 400 sccm, respectively, and the pressure was maintained at 60 Pa.

4: Plasma Oxidization Process

The silicon substrate on which the SiO$_2$ film had been formed in the above step 3 was modified by the following method. The silicon substrate on which the SiO$_2$ film had been formed in the above step 3 was heated to 400° C., an inert gas and oxygen were flown onto the substrate at flow rates of 1000 sccm and 20 sccm, respectively, and the pressure was maintained at 13–107 Pa (100 mTorr-900 mTorr). Such an atmosphere was irradiated with microwave of 3 W/cm$^2$ via a plane antenna member (SPA) having a plurality of slots so as to generate plasma including oxygen and the inert gas, and the SiO$_2$ film obtained in the step 3 was modified by using the thus generated plasma.

5: Film Formation of Poly-silicon

A poly-silicon film was formed by a CVD method as a gate electrode on the SiO$_2$ film which had been formed in the above steps 3 and 4. The silicon substrate having the SiO$_2$ film formed thereon was heated to 630° C., and a silane gas was introduced onto the substrate at 250 sccm under a pressure of 33 Pa, and this state was maintained for 30 min., to thereby form a poly-silicon film for an electrode having a film thickness of 3000 A on the SiO$_2$ film.

6: Doping of P (Phosphorus) to Poly-silicon

The silicon substrate which had been obtained in the above step 5 was heated to 800° C., and POCl gas, oxygen and nitrogen were introduced onto the substrate at normal pressure at 350 sccm, 200 sccm, and 20000 sccm, respectively, and this state was maintained for 24 min., to thereby dope the inside of the poly-silicon with phosphorus.

7: Patterning, Gate Etching

The silicon substrate which had been obtained in the above step 6 was subjected to patterning by lithography, and the silicon substrate was immersed in a liquid chemical having a ratio of $HF:HNO_3:H_2O=1: 60:60$ for three minutes so as to dissolve a portion of the poly-silicon which had not been subjected to the patterning, to thereby fabricate an MOS capacitor.

The measurement of the resultant MOS capacitor was conducted by the following method. A stress of a fixed electric current of $-0.1$ $A/cm^2$ was applied to the capacitor having a gate electrode area of 10000 $um^2$, so that the Break Down Time (Tbd), a period until the dielectric breakdown was to be caused was measured. The dielectric breakdown electric charge (Qbd) is the absolute value of the product of current stress of $-0.1$ $A/cm^2$ and the above-mentioned Tbd.

The graph (1) shows the Qbd value of an $SiO_2$ film (High Temperature Oxide: HTO) which had been formed by a conventional CVD method for the purpose of reference. The graph (2) shows the Qbd value of the product which had been obtained by plasma-processing the above-mentioned $SiO_2$ film at a pressure of 100 mTorr by use of SPA in the presence of $O_2$ and krypton as an inert gas. The graph (3) shows the Qbd value of the product which had been obtained by plasma-processing the above-mentioned $SiO_2$ film at a pressure of 500 mTorr by use of SPA in the presence of $O_2$ and krypton.

Similarly, the graph (4) shows the Qbd value of the product which had been obtained by plasma-processing the above-mentioned $SiO_2$ film at a pressure of 900 mTorr by use of SPA in the presence of $O_2$ and krypton.

As clearly understood from the graph of FIG. 9, the Qbd value of the of 502 film which had been modified according to the present invention is higher than the $SiO_2$ film which had been formed by a conventional CVD method. As a result, it is expected that the present invention provides a high-quality device having a high reliability in view of the device characteristic.

As described above, the process for producing an electronic device according to the present invention could form an oxide film having a higher quality by modification, as compared with that of the conventional CVD oxide film.

(Presumed Mechanism for High-quality Modified Insulating Film)

According to the present inventor's knowledge and investigations, the reason for the improvement in the film quality of the insulating film which has been formed by the above-mentioned process may be presumed as follows.

Thus, the plasma which has been formed by irradiating a process gas with microwave by use of an SPA is one having a high density and a relatively low electron temperature. Therefore, the present invention can generate high-density radicals, and the bias between the plasma and the surface of the substrate to be processed can be suppressed to a relatively low value, and the plasma damage is light. Therefore, it is considered that the dangling bonds present in the $SiO_2$ film can appropriately be terminated by the oxygen reactive species which have been generated by the plasma, and the weak Si—Si bond is changed into a strong Si—O—Si bond, to thereby form an $SiO_2$ film having a good electric characteristic as shown in FIG. 9 by modification.

EXAMPLES

Hereinbelow, the present invention will be described in further detail with reference to Examples.

An about 10 nm-thick first $SiO_2$ film is formed on a substrate to be processed comprising single-crystal silicon as a main component, and the above-mentioned substrate to be processed is CVD-treated, to thereby form an about 100 nm–300 nm thick first polycrystal silicon layer on the above first $SiO_2$ film. Then, the above-mentioned substrate to be processed is subjected to CVD-processing and a high-temperature oxidation heat treatment, to thereby form a second $SiO_2$ film having a thickness of about 5–10 nm on the above-mentioned first polycrystal silicon layer.

The resultant object to be processed is placed on a stage which has been heated to 400° C., and the surface of the second $SiO_2$ film is' exposed for about 2 min., under an atmosphere of argon of 1000 sccm, oxygen gas of 50 sccm (total pressure of 500 mT) to the plasma which has been generated by irradiating the atmosphere with microwave of 2 $W/cm^2$ via an SPA (Slot Plain Antenna). As a result of these steps, the second $SiO_2$ film which has been subjected to CVD and high-temperature oxidation heating processing is modified so as to improve the characteristic of the second $SiO_2$ film.

The present invention is not limited to the above-mentioned embodiment. For example, in the above embodiment, the insulating layer (layers of $SiO_2$) 26 between the two polycrystal silicon layers 25 and 28 is selectively surface-treated by using the process gas plasma which has been generated via SPA. However, it is also possible to surface-treat another insulating layer (e.g., either one or both of the $SiO_2$ layers 23 and 29) in a similar manner by using th process gas plasma which has been generated via SPA.

In addition, when the surfaces of the two polycrystal silicon layers 25 and 28 are surface-modified by using the process gas plasma which has been generated via SPA, the surfaces of the two polycrystal silicon layers 25 and 28 are smoothened, and it is expected that the insulating layer 26 (layer formed from $SiO_2$ or SiN) between the polycrystal silicon layers 25 and 28 is caused to have an improved reliability. In addition, when an inert gas and nitrogen gas are used as the process gas in this step, etc., the oxidation resistance of the polycrystal silicon layers 25 and 28 is improved, and it is expected that a variation in the area of the polycrystal silicon in the subsequent step can be suppressed.

Further, when the surface of the polycrystal silicon layer 25 is oxidized by using the process gas plasma which has been generated via SPA, it is also possible to form the $SiO_2$ constituting the layer 26. This step can conduct the treatment at a low temperature. In the ordinary thermal oxidation process, the device characteristic can be deteriorated due to a high temperature. By use of the step according to the present invention, however, an oxide film can be formed while suppressing the deterioration of the device characteristic (such as diffusion of a dopant).

In this case, it is possible that until the formation of the layers 25–27, the steps can be conducted in an automatic and continuous manner in a semiconductor manufacturing equipment as shown in FIG. 1, without exposing the resultant treated product to the atmosphere. As a result, it is expected that the reliability in the semiconductor performance is improved and the manufacturing steps can be simplified.

(Second Embodiment)

Hereinbelow, a second embodiment of the present invention will be described. In this second embodiment, an insulating film is surface-modified with an SPA plasma processing during the process for producing a logic device.

Figure 10:
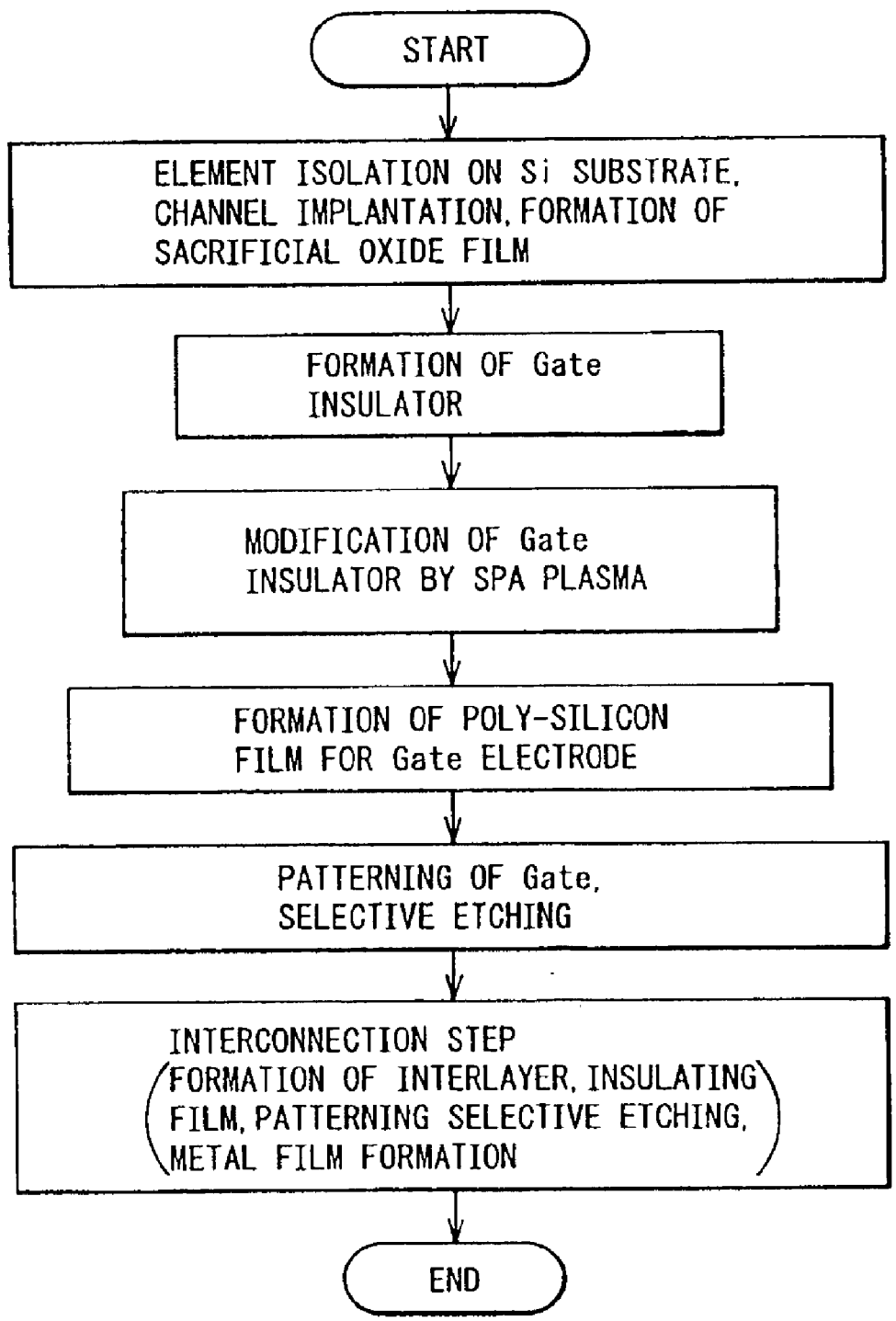
FIG. 10 is a flow chart showing examples of the respective steps in the production process for a logic device according to a second embodiment of the present invention.

FIG. 10 is a flowchart showing the manufacturing steps for the logic device relating to this embodiment. FIGS. 11A to 11F are schematic vertical sectional views showing the manufacturing steps for the logic device relating to this embodiment.

The production steps for the logic device relating to this embodiment can roughly classified into the following flows.

Element separation (or isolation)→MOS transistor fabrication→capacity fabrication→interlayer insulating film formation and wiring (or interconnection).

Hereinbelow, a general example will be described with respect to the fabrication of an MOS structure which is a preceding process during the fabrication of the MOS transistor including a process using an SPA.

1: A P-type or N-type silicon substrate is used as a substrate, and the substrate has a specific resistance of 1–30 Ωcm, and a plane orientation of (100).

As desired, in accordance with an intended use, the silicon substrate has been subjected to element isolation steps such as STI and LOCOS, or to channel implantation, whereby a sacrificial oxide film is formed on the silicon substrate (FIG. 11A), on which a gate oxide film and a gate insulator are to be formed.

2: Preliminary Washing Prior to Formation of Gate Oxide Film (Gate Insulator)

In general, the sacrificial oxide film and contaminating elements (metals, organic matters, particles) are removed by using the RCA-washing by use of a combination of APM (liquid mixture of ammonia, aqueous hydrogen peroxide, and pure water), HPM (liquid mixture of hydrochloric acid, aqueous hydrogen peroxide, and pure water) and DHF (liquid mixture of hydrofluoric acid and pure water). As desired, in some cases, it is also possible to use SPM (liquid mixture of sulfuric acid and aqueous hydrogen peroxide), water containing ozone, PPM (liquid mixture of hydrofluoric acid, aqueous hydrogen peroxide, and pure water), aqueous hydrochloric acid (liquid mixture of hydrochloric acid and pure water), organic alkali, etc.

3: Formation of Gate Oxide Film (Gate Insulator)

Figure 11A:
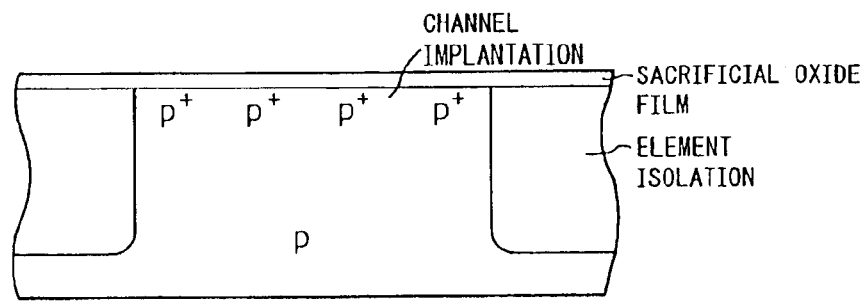
FIGS. 11A–11F are schematic sectional views in the vertical direction showing examples of the production process for a logic device according to the second embodiment of the present invention.
Figure 11B:
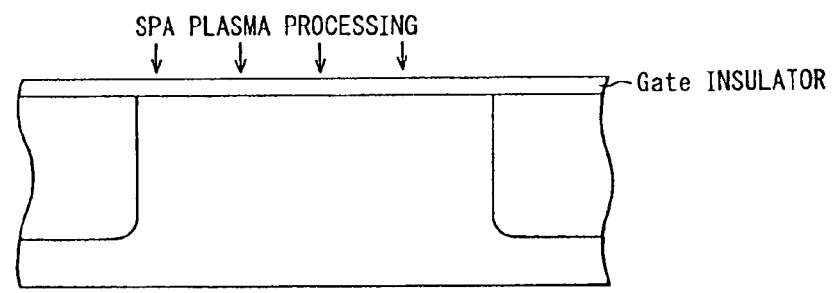

The gate insulator-forming steps are roughly classified into a process using thermal oxidation and a process using CVD. Herein, the formation of a gate insulator using CVD is mainly described. In the formation of the gate insulator by CVD, a raw material gas (for example, $SiH_4$ and $N_2O$) is supplied onto the above-mentioned silicon substrate which has been heated to a temperature in a range of 200° C. to 1000° C., so that reactive species formed by heat (for example, Si radicals and O radicals) are caused to react on the surface of the film, to thereby form a film (e.g., $SiO_2$). The reactive species can also be generated by plasma. In general, as the film thickness of the gate oxide film, a film thickness of 1 nm to 10 nm is used (FIG. 11B).

4: Modifying Treatment of Gate Insulator by SPA Plasma

The insulating film which has been obtained in the above step 3 is oxidized by mainly using an inert gas and oxygen as a gas for forming the SPA plasma, to thereby modify the CVD film. The effect of the oxidation may include an intended effect of improving the film quality by converting the weak Si—Si bonds into strong Si—O—Si bonds. In addition, it is possible to conduct a nitriding plasma treatment by using a gas comprising an inert gas and nitrogen as a gas for forming the SPA plasma. The effect of the nitriding may include a reduction in the film thickness due to an enhancement in the dielectric constant, the suppression of diffusion of the dopant from the gate electrode (FIG. 11B).

5: Film Formation of Poly-silicon for Gate Electrode

Figure 11C:
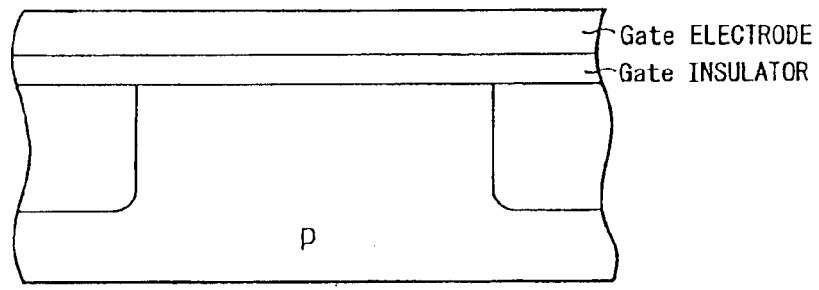
Figure 11D:
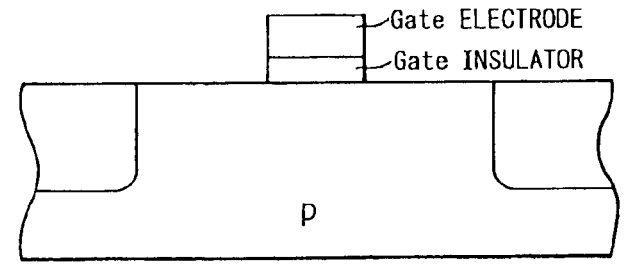

On the gate insulator (comprising a gate oxide film, a gate oxynitriding film) which has been formed in the above-mentioned steps 3 and 4, a film of poly-silicon (inclusive of amorphous silicon) is formed as a gate electrode of an MOS transistor by a CVD method. The silicon substrate on which the gate insulator has been formed is heated at a temperature in a range of 500° C. to 650° C., and a silicon-containing gas (silane, disilane, etc.) is introduced onto the substrate under a pressure of 10 to 100 Pa, to thereby form a poly-silicon film for an electrode having a film thickness of 50 nm to 500 nm on the gate insulator. AS the gate electrode, silicon germanium or a metal (such as w, Ru, TiN, Ta, Mo) can be used as the substitution for poly-silicon (FIG. 11C).

Figure 11E:
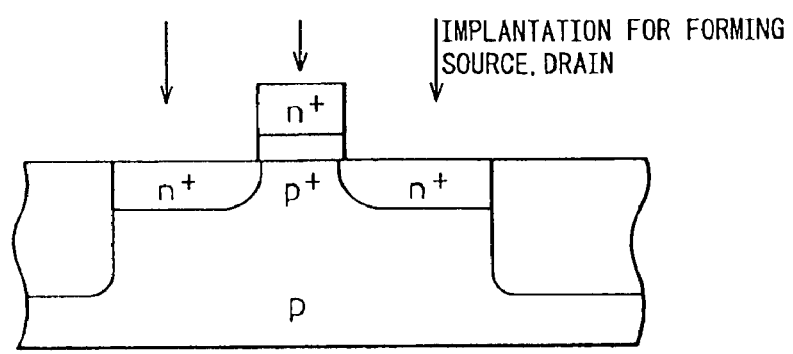
Figure 11F:
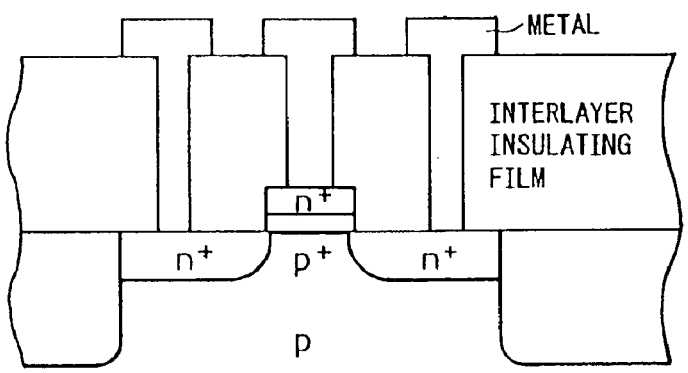
Figure 12:
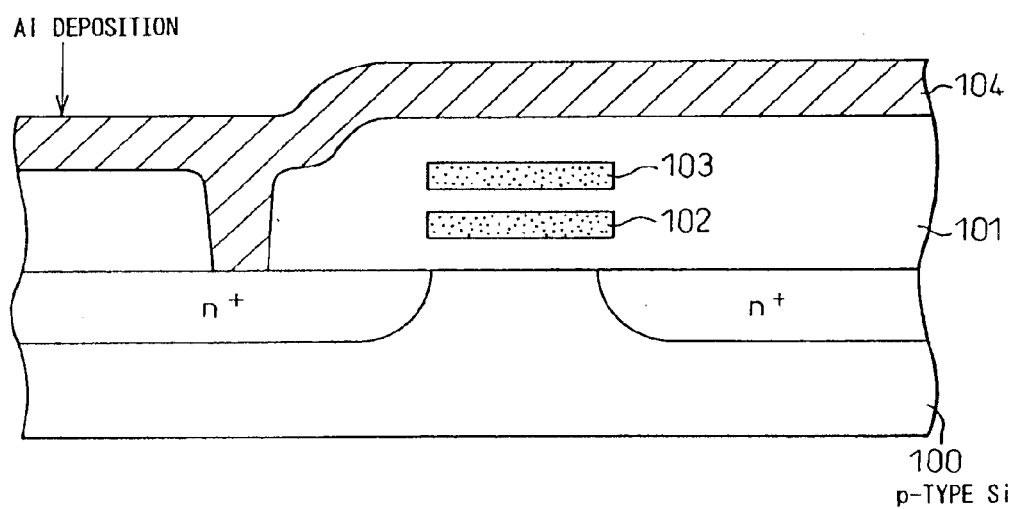
FIG. 12 is a schematic sectional view in the vertical direction showing a representative flash memory.

Subsequently, the patterning of the gate, and selective etching are conducted so as to form an MOS capacitor (FIG. 11D) and ion etching is conducted so as to form a source and a drain (FIG. 11E). Then, as subsequent steps, there is conducted a wiring process comprising a combination of formation of an interlayer insulating film, patterning, selective etching, and metal film formation, whereby a logic device according to this embodiment is obtained (FIG. 11F).

In this embodiment, an oxide film ($SiO_2$ film) is formed as an insulating film, but it is possible to form insulating film comprising another composition. As the gate insulator, it is possible to form one or at least two kinds selected from the group including: known materials such as $SiO_2$, SiON and SiN having a low dielectric constant; $Al_2O_3$, $ZrO_2$, $HfO_2$, $Ta_2O_5$ having a high dielectric constant; silicates such as ZrSiO, HfSiO and aluminates such as ZrAlO.

In this embodiment, the activated atoms supplied from the plasma having a low temperature and a high density which has been generated via an SPA, have an effect of terminating the surface and inside of a film. In addition, in this embodiment, it is expected that nitrogen-containing reactive species supplied from the plasma which has been generated from a gas comprising an inert gas and nitrogen, may enter the inside of the surface layer of a film, to thereby provide a barrier for suppressing the diffusion of a dopant from the polycrystal silicon.

INDUSTRIAL APPLICABILITY

As described hereinabove, according to the present invention, an insulating film disposed on a substrate for an electronic device is irradiated with microwave via a plane antenna member having a plurality of slots (i.e., by use of a method using a so-called SPA), so as to directly supply the plasma onto the silicon substrate, to thereby modify the insulating film (for example, $SiO_2$ film). As a result, the dangling bonds in the insulating film surface or inside of the film can preferably be terminated without damaging the insulating film per se. Accordingly, the present invention can provide a high-quality insulating film, and accordingly a high-quality electronic device (a semiconductor device, for example).

What is claimed is:

1. A method of processing for producing an electronic device material, comprising:

forming an insulating film on a substrate to be processed, and exposing the insulating film to a plasma which has been generated from a process gas by microwave irradiation via a plane antenna member having a plurality of slots, to thereby modify the insulating film.

2. A method of processing for producing an electronic device material according to claim 1, wherein the substrate for an electronic device is a semiconductor material.

3. A method of processing for producing an electronic device material according to claim 2, wherein the semiconductor material comprises a single-crystal silicon as a main component.

4. A method of processing for producing an electronic device material according to claim 1, wherein the substrate for an electronic device is a material for a liquid crystal device.

5. A method of processing for producing an electronic device material according to claim 1, wherein the insulating film is an insulating film which has been formed by CVD.

6. A method of processing for producing an electronic device material according to claim 1, wherein the process gas comprises an inert gas and oxygen ($O_2$) and/or nitrogen ($N_2$) and/or hydrogen ($H_2$).

7. A method of processing for producing an electronic device material according to claim 6, wherein the inert gas is selected from krypton, argon, and helium.

8. A method of processing for producing an electronic device material according to claim 7, wherein the process gas comprises $O_2$ at a flow rate of 1–1000 sccm; krypton, helium, xenon or argon at a flow rate of 200–3000 sccm; and hydrogen at a flow rate of 1–200 sccm.

9. A method of processing for producing an electronic device material according to claim 1, wherein the insulating film is modified at a temperature of from room temperature to 700° C., at a pressure of from 20 to 5000 mTorr, and the plasma is formed at a microwave output of from 0.5 to 5 W/cm$^2$.

10. A method of processing for producing an electronic device material, comprising:

forming a first $SiO_2$ film on a substrate to be processed;

forming a first polycrystal silicon layer disposed on the first $SiO_2$ film;

forming a second $SiO_2$ film disposed on the first polycrystal silicon layer; and exposing the substrate to a plasma which has been generated from a process gas by microwave irradiation via a plane antenna member having a plurality of slots, to thereby modify the second $SiO_2$ film.

11. A method of processing for producing an electronic device material according to claim 10, wherein a second polycrystal silicon layer is formed on the second $SiO_2$ film.

12. A method of processing for producing an electronic device material according to claim 10, wherein the first polycrystal silicon layer and/or the second $SiO_2$ film has been formed by CVD.

13. A method of processing for producing an electronic device material according to claim 11, wherein the second polycrystal silicon layer is formed by CVD.

14. A method of processing for producing an electronic device material according to, claim 10 wherein the second $SiO_2$ film on the first polycrystal silicon layer is formed by CVD.

15. A method of processing for producing an electronic device material according to claim 10, wherein the substrate for an electronic device is a semiconductor material.

16. A method of processing for producing an electronic device material according to claim 15, wherein the substrate for an electronic device comprises single-crystal silicon as a main component.

17. A method of processing for producing an electronic device material according to claim 10, wherein the substrate for an electronic device is a material for a liquid crystal device.

18. A method of processing for producing an electronic device material according to claim 10, which further comprises, between the step of forming the first polycrystal silicon layer and the step of forming the second $SiO_2$ film on the first polycrystal silicon layer; and/or after the formation of the second polycrystal silicon layer; exposing the substrate to be processed to the plasma which has been generated from a process gas by microwave irradiation via a plane antenna member having a plurality of slots, to thereby modify the first or second polycrystal silicon layer.

19. A method of processing for producing an electronic device material comprising:

exposing a substrate to be processed comprising at least a substrate for an electronic device, and an insulating film disposed on the substrate, to a plasma which has been generated from a process gas by microwave irradiation via plane antenna member having a plurality of slots, to thereby modify the insulating film; and forming a metal layer on the insulating film.

20. A method of processing for producing an electronic device material according to claim 19, wherein the insulating film is formed by CVD.

21. A method of processing for producing an electronic device material according to claim 19 or 20, wherein the substrate for an electronic device comprises Si as a main component.

22. A process for producing an electronic device material according to claim 1, 10, or 19, wherein the insulating film is one or at least two kinds selected from the group consisting of: $SiO_2$, silicon oxynitride film (SiON), silicon nitride (SiN), aluminum oxide ($Al_2O_3$), zirconium oxide ($ZrO_2$), hafnium oxide ($HfO_2$), silicates and aluminates.

23. A process for producing an electronic device material according to claim 22, wherein the silicate has a composition of ZrSiO or HfSiO, and/or the aluminate is one having a composition or ZrAlO or HfAlO.

24. A plasma processing method, comprising:

forming an insulating film on a substrate; and exposing the insulating film formed on the substrate to a plasma which has been generated from a process gas by microwave irradiation via a plane antenna member having a plurality of slots to thereby modify the insulating film, the process gas comprising an inert gas and at least one of oxygen, nitrogen, and hydrogen.

25. A plasma processing method according to claim 24, wherein the insulating film is an $SiO_2$ film.

26. A plasma processing method according to claim 24, wherein the inert gas is selected from krypton, argon, and helium.

27. A plasma processing method according to claim 24, wherein the process gas comprises $O_2$ at a flow rate of 1–1000 sccm, at least one of krypton, helium, xenon or argon at a flow rate of 200–3000 sccm, and hydrogen at a flow rate of 1–200 sccm.

28. A plasma processing method according to claim 24, wherein the insulating film is modified at a temperature of from room temperature to 700° C.

29. A plasma processing method according to claim 24, wherein the insulating film is modified at a pressure of from 20 to 5000 mTorr.

30. A plasma processing method according to claim 24, wherein the plasma is formed at a microwave output of from 0.5 to 5 W/cm$_2$.

31. A plasma processing method according to claim 24, wherein the plasma has an electron temperature of from 0.5 to 2.0 eV.

32. A plasma processing method according to claim 24, wherein the plasma has a density of from $1 \times 10^{10}$ to $5 \times 10^{12}$/cm$_3$.

33. A plasma processing method according to claim 24, wherein the insulating film is composed of one or more of the group consisting of $SiO_2$, silicon oxynitride, silicon nitride, aluminum oxide, zirconium oxide, hafnium oxide, silicates, and aluminates.

34. A plasma processing method according to claim 33, wherein the insulating film comprises a silicate having a composition of ZrSiO or HfSiO, or the insulating film comprises an aluminate having a composition of ZrAlO or HfAlO.

* * * * *